US011512944B2

(12) United States Patent
Mori et al.

(10) Patent No.: US 11,512,944 B2
(45) Date of Patent: Nov. 29, 2022

(54) SHEET-LIKE STRUCTURE, SHAPE ESTIMATION METHOD, AND SPACECRAFT

(71) Applicant: JAPAN AEROSPACE EXPLORATION AGENCY, Tokyo (JP)

(72) Inventors: Osamu Mori, Tokyo (JP); Ralf Christian Boden, Tokyo (JP); Javier Hernando Ayuso, Tokyo (JP)

(73) Assignee: Japan Aerospace Exploration Agency, Tokyo (JP)

( * ) Notice: Subject to any disclaimer, the term of this patent is extended or adjusted under 35 U.S.C. 154(b) by 244 days.

(21) Appl. No.: 16/627,095

(22) PCT Filed: Mar. 30, 2018

(86) PCT No.: PCT/JP2018/013902
§ 371 (c)(1),
(2) Date: Dec. 27, 2019

(87) PCT Pub. No.: WO2019/012755
PCT Pub. Date: Jan. 17, 2019

(65) Prior Publication Data
US 2020/0165011 A1 May 28, 2020

(30) Foreign Application Priority Data
Jul. 11, 2017 (JP) .............................. JP2017-135449

(51) Int. Cl.
*B64G 1/40* (2006.01)
*G01B 11/245* (2006.01)
(Continued)

(52) U.S. Cl.
CPC ............ *G01B 11/245* (2013.01); *B64G 1/244* (2019.05); *B64G 1/407* (2013.01); *B64G 1/66* (2013.01)

(58) Field of Classification Search
CPC .......... B64G 1/363; B64G 1/244; B64G 1/66; B64G 1/407; B64G 1/443; B64G 1/281;
(Continued)

(56) References Cited

U.S. PATENT DOCUMENTS 5,602,384 A * 2/1997 Nunogaki ............ B60H 1/0075
126/573
5,670,774 A * 9/1997 Hill ......................... G01S 3/784
126/573
(Continued)

FOREIGN PATENT DOCUMENTS

JP 2016-030486 A 3/2016
JP 2017-123921 A 7/2017

OTHER PUBLICATIONS

International Search Report, dated Jul. 3, 2018 in International Application No. PCT/JP2018/013902.
(Continued)

*Primary Examiner* — Sang H Nguyen
(74) *Attorney, Agent, or Firm* — Saliwanchik, Lloyd & Eisenschenk (57) ABSTRACT

To provide a sheet-like structure capable of highly accurately estimating a sheet-like shape.
A sheet-like structure includes a sheet-like member and a plurality of detection sensors. The sheet-like member extends along an in-plane direction orthogonal to a thickness direction and receives light incident on the sheet-like member. The plurality of detection sensors are dispersedly arranged on the sheet-like member along the in-plane direction and are for detecting an incident angle of the light with respect to the sheet-like member at each arrangement position of the plurality of detection sensors.

7 Claims, 3 Drawing Sheets

(51) Int. Cl.
*B64G 1/66* (2006.01)
*B64G 1/24* (2006.01)

(58) Field of Classification Search
CPC ........... B64G 1/222; B64G 1/26; H02S 30/00; H02S 10/40; G01B 11/245; H01L 31/0445; Y02E 10/50
See application file for complete search history.

(56) References Cited

U.S. PATENT DOCUMENTS

| | | | |
|---|---|---|---|
| 6,019,320 A | | 2/2000 | Shah et al. |
| 7,560,676 B2 * | | 7/2009 | Moon .................. G01J 1/06 250/203.4 |
| 8,358,419 B2 * | | 1/2013 | Walters ............... C12Q 1/6837 356/445 |
| 8,552,285 B2 * | | 10/2013 | Tseng .................. G01S 3/7861 136/246 |
| 9,013,102 B1 * | | 4/2015 | Wedding .............. H01J 11/18 250/374 |
| 9,116,046 B2 * | | 8/2015 | Fant ....................... G01J 1/44 |
| 2002/0014262 A1 * | | 2/2002 | Matsushita ........... G08B 13/128 136/244 |
| 2010/0000594 A1 * | | 1/2010 | Zalusky ................ H01L 31/052 136/246 |
| 2013/0219889 A1 * | | 8/2013 | Shao ..................... H02K 7/1823 60/641.15 |
| 2014/0183342 A1 * | | 7/2014 | Shedletsky ........... H01L 51/5234 250/215 |
| 2014/0264700 A1 | | 9/2014 | Janson |
| 2015/0136944 A1 * | | 5/2015 | Segev .................. G01S 3/7861 250/203.4 |
| 2016/0056757 A1 * | | 2/2016 | Neuhausler ......... H01L 31/0543 136/246 |
| 2016/0311558 A1 | | 10/2016 | Turse et al. |

OTHER PUBLICATIONS

Mori, O. et al., "Summary of Development and Operation of IKAROS", Aeronautical and Space Sciences Japan, Aug. 2012, 60(8):283-289, along with its English translation.

* cited by examiner

SHEET-LIKE STRUCTURE, SHAPE ESTIMATION METHOD, AND SPACECRAFT

CROSS-REFERENCE TO RELATED APPLICATIONS

This application is the U.S. national stage application of International Patent Application No. PCT/JP2018/013902, filed Mar. 30, 2018, which claims the benefit under 35 U.S.C. § 119 of Japanese Application No. 2017-135449, filed Jul. 11, 2017, the disclosures of each of which are incorporated herein by reference in their entirety.

TECHNICAL FIELD

The present invention relates to a sheet-like structure, a shape estimation method, and a spacecraft.

BACKGROUND ART

A sheet-like member is used in a wide variety of uses in various technical fields. For example, Non-Patent Literature 1 describes a solar sail, "IKAROS". The solar sail is a space yacht including a sail that receives sunlight. The solar sail navigates in space by using, as propulsion force, a radiation pressure that the sail receives from the sunlight.

The sail is configured by extending a sheet-like thin film in space. The extended sail becomes a large-sized structure having an area of approximately 200 m². Such an enlargement of the area of a membrane surface that receives the sunlight increases a radiation pressure that acts on the solar sail, and a propulsion force necessary to navigate is obtained.

CITATION LIST

Non-Patent Literature

Non-Patent Literature 1: Osamu MOM, Junichiro KAWAGUCHI (et al.), "Summary of Development and Operation of IKAROS", Aeronautical and Space Sciences Japan, Vol. 60, No. 8, pp.283-289 (August 2012)

DISCLOSURE OF INVENTION

Technical Problem

However, the sheet-like member has problems such as being easy to deflect. For example, in the solar sail described in Non-Patent Literature 1, a radiation pressure corresponding to the shape of the extended sail acts on the extended sail. For example, in a state where the shape of the sail is different from an assumed shape due to deflection or the like of the sail, such a possibility that the radiation pressure acts in an unintentional direction and an attitude or the like of the solar sail deviates is caused. For that reason, grasping the shape of the extended sail is important.

For example, Non-Patent Literature 1 describes monitor cameras installed in a spacecraft main body and separation cameras that separate from the spacecraft main body. In the solar sail, images of the sail are captured using the monitor cameras and the separation cameras, and thus an extended state of the sail can be confirmed. However, in the method of capturing images of the sail using the cameras, a range available for image-capturing, or the like is limited. This may make it difficult to accurately grasp the shape such as unevenness of the sail.

In view of the circumstances described above, it is an object of the present invention to provide a sheet-like structure, a shape estimation method, and a spacecraft, which are capable of highly accurately estimating a sheet-like shape.

Solution to Problem

In order to achieve the object described above, according to an embodiment of the present invention, there is provided a sheet-like structure including a sheet-like member and a plurality of detection sensors.

The sheet-like member extends along an in-plane direction orthogonal to a thickness direction and receives light incident on the sheet-like member.

The plurality of detection sensors are dispersedly arranged on the sheet-like member along the in-plane direction and are for detecting an incident angle of the light with respect to the sheet-like member at each arrangement position of the plurality of detection sensors.

In the sheet-like structure, the plurality of detection sensors are dispersedly arranged on the sheet-like member, on which light is incident, along the in-plane direction of the sheet-like member. From a detection result of each detection sensor, an incident angle of the light with respect to the sheet-like member at the arrangement position of each detection sensor is detected. This allows a sheet-like shape to be highly accurately estimated.

The light may include sunlight. In this case, the plurality of detection sensors may include a thin-film solar cell.

For example, use of the thin-film solar cell allows an incident angle of the sunlight to be easily detected and allows the sheet-like shape to be easily estimated.

The plurality of detection sensors may include a temperature sensor.

For example, use of the temperature sensor allows an incident angle of the light to be easily detected and allows the sheet-like shape to be easily estimated.

According to an embodiment of the present invention, there is provided a shape estimation method including setting a reference plane of a sheet-like structure on which light is incident.

First information regarding an incident direction of the light with respect to the reference plane is acquired.

Second information regarding incident angles of the light with respect to the sheet-like structure at a plurality of detection positions is acquired in two or more states in which the incident directions are different from one another, the plurality of detection positions being dispersedly arranged on the sheet-like structure.

A shape of the sheet-like structure is estimated on the basis of the first information and the second information in the two or more states.

In the shape estimation method, the first information regarding an incident direction of the light with respect to the reference plane of the sheet-like structure, and the second information regarding incident angles of the light with respect to the sheet-like structure at a plurality of detection positions are acquired. Using the first information and the second information acquired in two or more states in which the incident directions with respect to the reference plane are different from one another, a sheet-like shape can be highly accurately estimated.

In the shape estimation method, a position in an orthogonal direction orthogonal to the reference plane may be estimated for each of the plurality of detection positions of the sheet-like structure, to estimate the shape of the sheet-like structure.

This allows the shape of the sheet-like structure to be estimated from a component in a direction orthogonal to the reference plane. As a result, the amount of operation for shape estimation, or the like is suppressed, and an operation speed is improved.

In the shape estimation method, the shape of the sheet-like structure may be monitored.

This allows the shape of the sheet-like structure to be monitored in real time, for example.

According to an embodiment of the present invention, there is provided a spacecraft including a sheet-like structure and a main body connected to the sheet-like structure.

The sheet-like structure includes a sheet-like member and a plurality of detection sensors.

The sheet-like member extends along an in-plane direction orthogonal to a thickness direction and receives light incident on the sheet-like member.

The plurality of detection sensors are dispersedly arranged on the sheet-like member along the in-plane direction and are for detecting an incident angle of the light with respect to the sheet-like member at each arrangement position of the plurality of detection sensors.

The light may include sunlight. In this case, the main body may include a sun sensor that detects an incident direction of the sunlight.

Advantageous Effects of Invention

According to the present invention, it is possible to provide a sheet-like structure, a shape estimation method, and a spacecraft, which are capable of highly accurately estimating a sheet-like shape.

MODE(S) FOR CARRYING OUT THE INVENTION

Hereinafter, a solar sail, which is an example of a sheet-like structure, will be described as an embodiment of the present invention with reference to the drawings. Further, light will be described as sunlight. It should be noted that the present invention is not construed as limiting by the following embodiment.

1. Configuration of Sail

Figure 1:
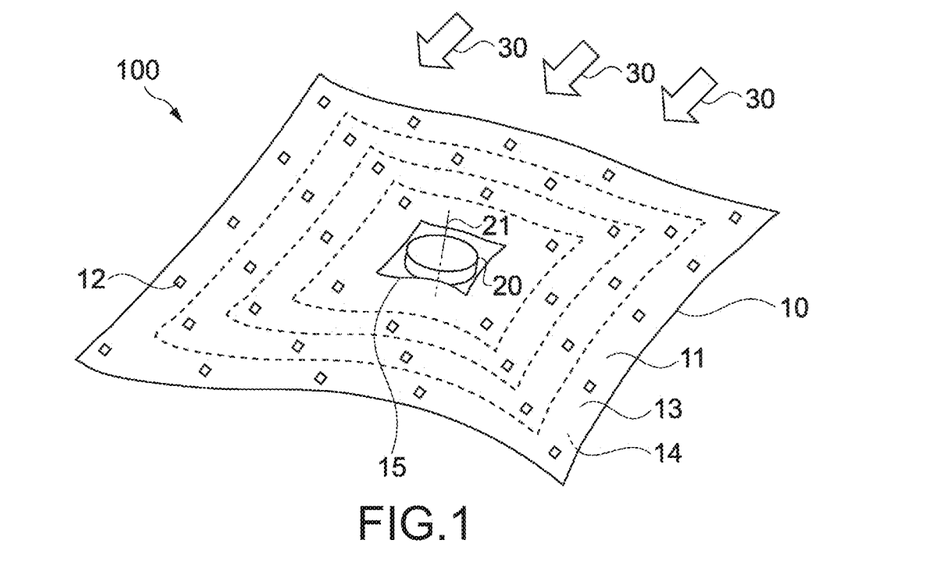
FIG. 1 is a perspective view of a spacecraft including a sail according to an embodiment of the present invention.

FIG. 1 is a perspective view of a spacecraft 100 including a sail 10 according to an embodiment of the present invention. As shown in FIG. 1, the spacecraft 100 includes the sail 10 and a spacecraft main body 20. The spacecraft 100 is a solar sail that navigates in space, extending the sail 10. In this embodiment, the sail 10 corresponds to a sheet-like structure.

As shown in FIG. 1, the sail 10 includes a sheet-like member 11 and a plurality of detection sensors 12. The sheet-like member 11 has a sheet-like shape extending along an in-plane direction orthogonal to a thickness direction and having flexibility. Thus, the sheet-like member 11 has a thin and wide surface capable of being easily bent. FIG. 1 schematically illustrates deflection of the sheet-like member 11 or a solid shape such as unevenness by using dotted lines.

The sheet-like member 11 includes a front surface 13, a back surface 14, and an aperture 15. The front surface 13 is a surface, which is directed toward the sun and on which sunlight 30 is incident. It should be noted that FIG. 1 schematically illustrates the sunlight 30 incident on the front surface 13 by using arrows.

The back surface 14 is a surface opposite to the side, of the sheet-like member 11, on which the sunlight 30 is incident. Thus, the thickness direction of the sheet-like member 11 is a direction orthogonal to the front surface 13 and the back surface 14, and the in-plane direction is a direction along the front surface 13 and the back surface 14. The aperture 15 is arranged at the center of the sheet-like member 11. In the aperture 15, the spacecraft main body 20 is installed.

Figure 4:
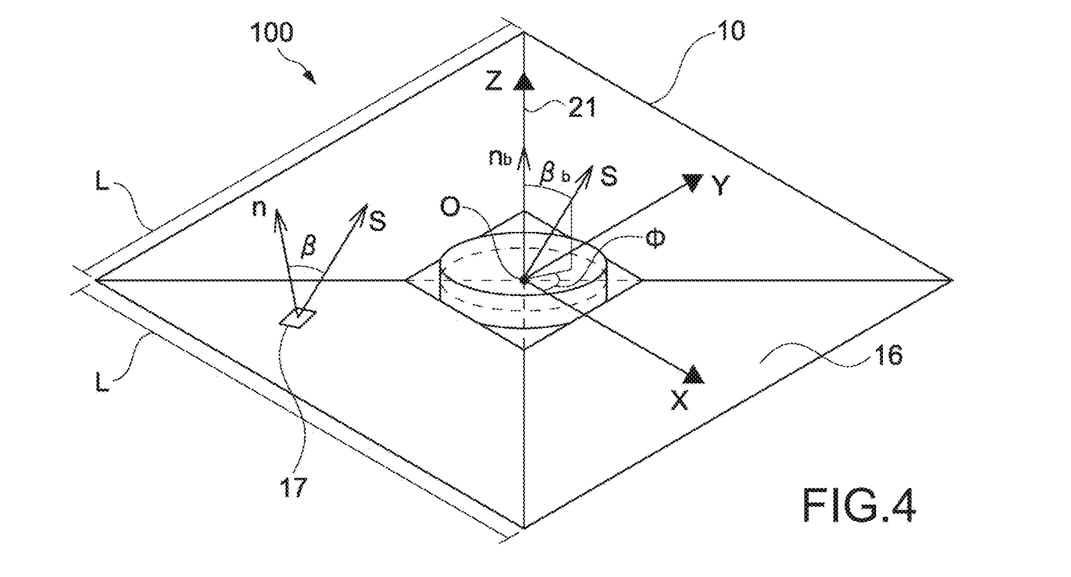
FIG. 4 is a schematic view of the sail extended on a plane.

In a case where the sheet-like member 11 is extended on a plane, the planar shape of the sheet-like member 11 is a substantially square (see FIG. 4). The length of one side of the square is set to, for example, approximately 14 m. In this case, the area of the square is approximately 200 m². Further, the thickness of the sheet-like member 11 is set to several micrometers. With this configuration, it is possible to achieve a sail 10 that is lightweight while having a large-sized structure. The present invention is applicable irrespective of the planar shape, the size, the thickness, and the like of the sheet-like member 11.

For the sheet-like member 11, for example, a thin film made of polyimide resin or the like, which is capable of extending in a space environment, is used. Further, aluminum is vapor-deposited on the sheet-like member 11, and such a sheet-like member 11 is capable of reflecting the sunlight 30. With this configuration, the sheet-like member 11 is capable of efficiently receiving a radiation pressure due to the sunlight 30 and is capable of producing a sufficient propulsion force. The specific configuration of the sheet-like member 11 is not limited. For example, an optional configuration capable of receiving a radiation pressure due to the sunlight 30 may be used.

The plurality of detection sensors 12 are each a sensor for detecting an incident angle of the sunlight 30 with respect to the sheet-like member 11. The plurality of detection sensors 12 are dispersedly arranged on the front surface 13 of the sheet-like member 11 along the front surface 13. For example, the plurality of detection sensors 12 are dispersedly arranged at predetermined intervals such that the density of the sensors is balanced. As a matter of course, in accordance with the configuration of the sheet-like member 11 or the like, an arrangement position of each detection sensor 12, or the like may be appropriately set.

In this embodiment, a thin-film solar cell is used for the detection sensor 12. The thin-film solar cell is configured using, for example, an amorphous silicon (a-Si) cell having a thickness of several tens of micrometers. Using such a thin element allows the load on the sheet-like member 11 or the like to be sufficiently suppressed and, for example, allows the sheet-like member 11 to be suitably extended.

Figure 2:
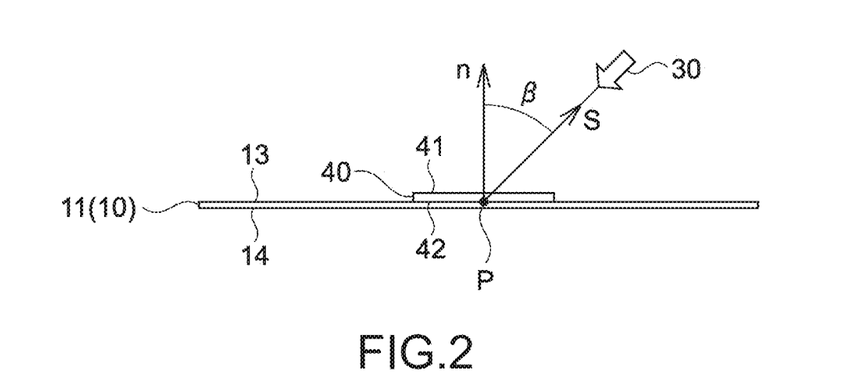
FIG. 2 is a schematic view of a configuration example of a thin-film solar cell.

FIG. 2 is a schematic view of a configuration example of a thin-film solar cell 40. The thin-film solar cell 40 (detection sensor 12) includes an incident surface 41 on which the sunlight 30 is incident, and a rear surface 42 opposite to the incident surface 41. The thin-film solar cell 40 is configured such that the incident surface 41 and the rear surface 42 are substantially parallel to each other. The thin-film solar cell 40 is arranged at an arrangement position P (black circle in the figure) with the rear surface 42 facing the front surface 13 of the sheet-like member 11.

At the arrangement position P, the direction orthogonal to the incident surface 41 of the thin-film solar cell 40 and the direction orthogonal to the front surface 13 of the sheet-like member 11 are substantially the same direction. In other words, the normal direction of the incident surface 41 of the thin-film solar cell 40 is substantially parallel to the normal direction of the front surface 13 of the sheet-like member 11 at the arrangement position P. FIG. 2 shows, using a local normal vector n, the normal direction of the front surface 13 of the sheet-like member 11 at the arrangement position P.

As shown in FIG. 2, an incident angle of the sunlight 30 with respect to the sheet-like member 11 at the arrangement position P is an angle defined by the local normal vector n and a sun vector S at the arrangement position P. Here, the sun vector S is a unit vector representing a direction toward the sun when the sun is viewed from the arrangement position P. Thus, the sunlight 30 is incident along the direction parallel to the sun vector S.

The sunlight 30 is incident on the incident surface 41 of the thin-film solar cell 40, which is arranged at the arrangement position P, at an angle substantially equal to the incident angle of the sunlight 30 with respect to the sheet-like member 11 at the arrangement position P. Hereinafter, the incident angles of the sunlight 30 incident on the sheet-like member 11 and the thin-film solar cell 40 will be described as an incident angle $\beta$ by using the same reference symbol $\beta$.

Figure 3:
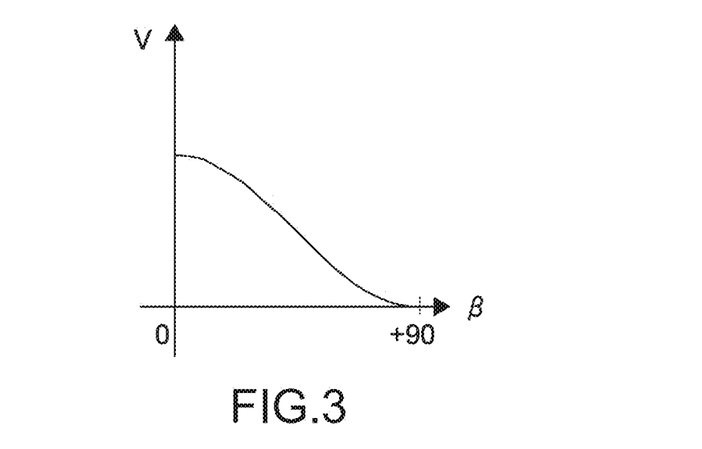
FIG. 3 is a graph showing a relationship between a voltage output and an incident angle β of the thin-film solar cell.

FIG. 3 is a graph showing a relationship between a voltage output and the incident angle $\beta$ of the thin-film solar cell 40. The horizontal axis of FIG. 3 is the incident angle $\beta$ with respect to the incident surface 41 of the thin-film solar cell 40. Further, the vertical axis is a voltage V, which is output from the thin-film solar cell 40.

A voltage V corresponding to the incident angle $\beta$ is output from the thin-film solar cell 40. Specifically, the voltage V of the thin-film solar cell 40 takes a value proportional to $\cos(\beta)$. Thus, as shown in FIG. 3, in a case where the sunlight 30 is incident from a direction ($\beta=0°$) orthogonal to the thin-film solar cell 40, the voltage V is maximum. Further, in a case where the sunlight 30 is incident from a direction ($\beta=90°$) parallel to the thin-film solar cell 40, the voltage V is zero.

For example, the relationship between the voltage V, which is output from the thin-film solar cell 40, and the incident angle $\beta$ is measured and stored in advance. Referring to the relationship between the voltage V and the incident angle $\beta$, the incident angle $\beta$ of the sunlight 30 incident on the thin-film solar cell 40 can be detected from the voltage V ($\propto \cos(\beta)$) of the thin-film solar cell 40. In other words, the incident angle $\beta$ of the sunlight 30 with respect to the sheet-like member 11 at the arrangement position P can be detected from the voltage V of the thin-film solar cell 40.

As shown in FIG. 1, the spacecraft main body 20 has a columnar shape extending along the center axis 21. The spacecraft main body 20 is arranged at the aperture 15 of the sail 10. The spacecraft main body 20 and the sail 10 are mechanically and electrically connected to each other via tethers and harnesses not shown in the figure. The spacecraft main body 20 includes a sun sensor, an attitude control mechanism, and a shape estimation processing unit (each of which is not illustrated).

The sun sensor (light sensor) detects an incident direction of the sunlight 30. In other words, the sun sensor detects a direction toward the sun when the sun is viewed from the spacecraft. A specific configuration of the sun sensor or the like is not limited and, for example, an optional sensor capable of detecting the incident direction of the sunlight 30 may be used.

The attitude control mechanism includes a thruster for controlling the attitude of the spacecraft, or the like. The spacecraft main body 20 is capable of performing rotary motion with the center axis 21 being as a reference by using the attitude control mechanism. In the spacecraft 100, the large sail 10 is deployed and extended using a centrifugal force generated by the rotary motion. Thus, the spacecraft 100 navigates in space, with the sail 10 being extended, while rotating with the center axis 21 being as the reference and.

The shape estimation processing unit acquires outputs from the plurality of detection sensors 12 and the sun sensor. The shape estimation processing unit is capable of executing the processing of estimating the shape of the sail 10, which will be described later, or the like on the basis of the acquired data. Further, the shape estimation processing unit may perform communication with a control system on the ground or the like via a communication antenna. For the shape estimation processing unit, for example, a computer can be used. The operation of each unit of the spacecraft 100 may be appropriately controlled by the computer.

FIG. 4 is a schematic view of the sail 10 extended on a plane. FIG. 4 shows the sail 10 (sheet-like member 11) two-dimensionally extended along a plane orthogonal to the center axis 21 of the spacecraft main body 20. A plane including the two-dimensionally extended sail 10 is set to a reference plane 16 of the sail 10. In other words, a plane on which the sail 10 is two-dimensionally extended so as to be orthogonal to the center axis 21 of the spacecraft main body 20 is set to the reference plane 16. It should be noted that the method of setting the reference plane 16 or the like is not limited, and the reference plane 16 may be appropriately set according to the configuration of the sail 10 or the like.

In the spacecraft 100, the X-axis, the Y-axis, and the Z-axis orthogonal to one another are set with a point, at which the center axis 21 of the spacecraft main body 20 and the reference plane 16 intersects with each other, being as the origin O. In other words, the axes are set such that the XY-plane becomes the reference plane 16, and a direction parallel to the Z-axis becomes a direction orthogonal to the reference plane 16. It should be noted that the method of setting the reference plane 16, the origin O of the X-, Y-, and Z-axes, or the like is not limited and may be appropriately set according to the configuration of the sail 10 or the like.

As described above, the sun sensor detects the incident direction of the sunlight 30. In this embodiment, the sun sensor detects a sun vector $S=(s_x, s_y, s_z)^T$ on the XYZ coordinates set on the reference plane 16 of the sail 10. Here, the superscript "T" represents the transposition of the vector.

As shown in FIG. 4, the sun vector S can be represented using the incident angle of the sunlight 30 with respect to the reference plane 16 (reference incident angle $\beta b$) and an azimuthal angle $\Phi$. The reference incident angle $\beta b$ is an angle defined by a reference normal vector nb, which represents a normal direction of the reference plane 16, and the sun vector S. Further, the azimuthal angle Φ is an angle defined by a component, of the sun vector S, which is parallel to the reference plane 16, and the X-axis, and is also an angle representing the azimuth direction of the sun vector S on the XY-plane.

The sun sensor detects, for example, the reference incident angle βb and the azimuthal angle Φ of the sunlight 30 to detect the sun vector S. As a matter of course, XYZ components of the sun vector S may be directly detected. In addition to the above, an optional method capable of detecting the incident direction of the sunlight 30 with respect to the reference plane 16 may be used. In this embodiment, the reference incident angle βb and the azimuthal angle Φ are included in first information regarding the incident direction of the sunlight 30 with respect to the reference plane.

In general, a distance between the sun and the spacecraft 100 is sufficiently large. So, the sunlight 30 incident on the sail 10 can be considered to be substantially parallel light. Thus, the sun vector S is constant irrespective of the position of the sail 10.

Meanwhile, in the actual spacecraft 100, the shape of the sail 10 includes three-dimensionally unevenness such as deflection as shown in FIG. 1. Thus, the normal direction at each position of the sail 10 is directed toward a direction corresponding to the shape of the sail 10.

FIG. 4 schematically shows a partial region 17 in a case where the sail 10 has a three-dimensional shape, and a local normal vector n in the partial region 17. An incident angle β of the sunlight 30 incident on the partial region 17 is an angle defined by the local normal vector n and the sun vector S. Thus, the incident angle β in the partial region 17 is an angle corresponding to the orientation of the local normal vector n.

As described above, the incident angle β of the sunlight 30 with respect to the sail 10 (sheet-like member 11) at each position on the sail 10 is an angle corresponding to the shape at each position. Hereinafter, the incident angle β at each position will be described as a local incident angle β.

As described above, an output of the detection sensor 12 arranged at each arrangement position P on the sail 10 (the voltage V of the thin-film solar cell 40) is acquired, and thus the local incident angle β at each arrangement position P is detected. In this embodiment, the outputs from the plurality of detection sensors 12 are included in second information regarding the incident angles of the sunlight with respect to the sheet-like structure at a plurality of detection positions dispersedly arranged on the sheet-like structure.

2. Shape Estimation of Sail 10

In this embodiment, the shape of the sail 10 is expressed using an XYZ coordinate system with the reference plane 16 of the sail 10 being as a reference. Hereinafter, it is assumed that the deformation of the sail 10 in the in-plane direction can be ignored. Thus, a deformation in a direction (Z-axis direction) orthogonal to the in-plane direction of the sail 10 is estimated, and the shape of the sail 10 is thus estimated. Hereinafter, the length of a side of the square-shaped sail will be described as L.

An optional point r on the incident surface 41 on the sail 10 (sheet-like member 11) is represented as $r=(x, y, z)^T$ using the XYZ coordinate system. Using a patch of the Monge form, the point r is rewritten as follows.

[Math. 1]

$$r(\xi, \eta) = \begin{pmatrix} x \\ y \\ z \end{pmatrix} \equiv \begin{pmatrix} \xi \\ \eta \\ z(\xi, \eta) \end{pmatrix}, (\xi, \eta) \in [-1, 1] \times [-1, 1] \quad (1)$$

Here, ξ and η are parameters respectively corresponding to an X component and a Y component of the point r. It should be noted that ξ and η are values normalized by half the length (L/2) of the side L of the sail 10 and are each set to a value from −1 to 1. In the Monge form, as shown in Expression (1), z, which is a Z component of the point r, is replaced with z(ξ, η) as a function of ξ and η. Thus, the point r on the sail 10 can be considered to be a function r(ξ, η) of ξ and η.

In the replacement shown in Expression (1), that is, the parametric presentation from r(x, y, z) to r(ξ, η), partial derivatives for r regarding ξ and η have a linear independent relationship. Specifically, the partial derivatives for r using the parameters ξ and η are expressed as follows.

[Math. 2]

$$r_\xi = \frac{\partial r}{\partial \xi} = \begin{pmatrix} 1 \\ 0 \\ \frac{\partial z}{\partial \xi} \end{pmatrix}, r_\eta = \frac{\partial r}{\partial \eta} = \begin{pmatrix} 0 \\ 1 \\ \frac{\partial z}{\partial \eta} \end{pmatrix} \quad (2)$$

Partial derivatives $r_\xi$ and $r_\eta$ for r represent vectors parallel to a plane being in contact with the sail 10 at the point r (tangent plane). The direction orthogonal to the tangent plane is a normal direction at the point r. Thus, a local normal vector n at the point r is expressed as follows using a vector product $(r_\xi \times r_\eta)$ of the partial derivatives $r_\xi$ and $r_\eta$ for r.

[Math. 3]

$$n = \frac{r_\xi \times r_\eta}{\|r_\xi \times r_\eta\|} = \frac{\left(-\frac{\partial z}{\partial \xi}, -\frac{\partial z}{\partial \eta}, 1\right)^T}{\sqrt{1 + \left(\frac{\partial z}{\partial \xi}\right)^2 + \left(\frac{\partial z}{\partial \eta}\right)^2}} \quad (3)$$

As shown in Expression (3), the local normal vector n is a unit vector normalized by an absolute value of the vector product, $\|r_\xi \times r_\eta\|$. Further, the local normal vector n is expressed using a partial derivative of z(ξ, η) regarding ξ and η.

For the Z component (z(ξ, η)) of the sail 10, power series expansion regarding ξ and η will be considered. When the center r(0, 0) of the sail 10 is set as a reference and expanded as infinite series, z(ξ, η) is expressed by the following expression.

[Math. 4]

$$z(\xi, \eta) = \sum_{k=0}^{\infty} \sum_{l=0}^{k} a_{kl} \frac{1}{k!} \binom{k}{l} \xi^k \eta^{l-k} \quad (4)$$

It should be noted that "( )" in the right side of Expression (4) represents a binomial coefficient and represents, for example, a coefficient of the term $\alpha^1$ in the expansion of $(1+\alpha)^k$. A maximum value $k_{max}$ of a degree expanded in Expression (4) can be set to round off a degree larger than $k_{max}$. The method of setting the maximum value $k_{max}$ or the like is not limited. For example, the maximum value $k_{max}$ may be appropriately set according to requested calculation accuracy or the like. If the sum in the Expression (4) is rewritten and an expansion coefficient is defined again, the Z component $z(\xi, \eta)$ component q) of the sail 10 is expressed as follows.

[Math. 5]

$$z(\xi, \eta) \simeq \sum_{k=0}^{k_{max}} h_k(\xi, \eta) a_k = h^T(\xi, \eta) a \quad (5)$$

As shown in Expression (5), $z(\xi, \eta)$ can be expressed using an inner product $h^T(\xi, \eta)a$ of a vector $h^T(\xi, \eta)$ regarding $\xi$ and $\eta$ and a vector a regarding an expansion coefficient $a_k$. It should be noted that the vector $h^T(\xi, \eta)$ is specifically expressed by the following expression.

[Math. 6]

$$h(\xi,\eta) = 1, \xi, \eta, \xi^2, 2\xi\eta, \eta^2, \xi^3, 3\xi^2\eta, 3\xi\eta^2, \ldots )^T \quad (6)$$

Using Expression (5) in such a manner, the shape of the sail 10 (Z component of the point r) can be expressed by the expansion coefficient, the vector $a = (a_0, a_1, a_2, a_3, \ldots)^T$. In other words, specifically calculating the expansion coefficient a allows the shape of the sail 10 to be estimated.

As described above, Expression (3) expressing the local normal vector n can be expressed using the partial derivatives of $z(\xi, \eta)$ regarding $\xi$ and $\eta$. For example, it is assumed that $z(\xi, \eta)$ shown in Expression (5) is subjected to partial differentiation to express the local normal vector n. In this case, the partial derivatives of $z(\xi, \eta)$ regarding $\xi$ and $\eta$ can be expressed in a simple form as follows.

[Math. 7]

$$\frac{\partial z}{\partial \xi} = h_\xi^T a, \quad \frac{\partial z}{\partial \eta} = h_\eta^T a \quad (7)$$

Here, $h_\xi^T$ and $h_\eta^T$ express partial derivatives of $h^T(\xi, \eta)$ regarding $\xi$ and $\eta$. $h_\xi^T$ and $h_{72}^T$ are specifically expressed by the following expression.

[Math. 8]

$$h_\xi = \frac{\partial h}{\partial \xi} = (0, 1, 0, 2\xi, 2\eta, 0, 3\xi^2, 6\xi\eta, 3\eta^2, \ldots)^T \quad (8)$$

[Math. 9]

$$h_\eta = \frac{\partial h}{\partial \eta} = (0, 0, 1, 0, 2\xi, 2\eta, 0, 3\xi^2, 6\xi\eta, \ldots)^T \quad (9)$$

Thus, the partial derivatives of $z(\xi, \eta)$ regarding $\xi$ and $\eta$ shown in Expression (7) are substituted in Expression (3), and thus the local normal vector n can be expressed in the form including the expansion coefficient a. Further, using the local normal vector n, the local incident angle $\beta$ of the sunlight 30 with respect to the sail 10, the sunlight 30 being incident on an optional point on the sail 10, can be expressed.

As described with reference to FIG. 4, the local incident angle $\beta$ of the sunlight 30 at the point $r(x, y) = r(x(\xi), y(\eta))$ on the sail 10 is an angle between the sun vector S and the local normal vector n at the point r. An inner product of the local normal vector n and the sun vector S is $n \cdot S = |n||S|\cos(\beta)$. Since the local normal vector n and the sun vector S are unit vectors, the magnitude of each vector is 1. Thus, $n \cdot S = \cos(\beta)$.

A cosine of the local incident angle $\beta$ of the sunlight 30, that is, $\cos(\beta)$, is expressed by the following expression using the local normal vector n shown in Expression (3) and the sun vector $S = (s_x, s_y, s_z)^T$.

[Math. 10]

$$\cos\beta = n \cdot s = \frac{s_z - s_x h_\xi^T a - s_y h_\eta^T a}{\sqrt{1 + (h_\xi^T a)^2 + (h_\eta^T a)^2}} \quad (10)$$

As shown in Expression (10), $\cos(\beta)$ is a function of the expansion coefficient a and the sun vector S. In other words, the local incident angle $\beta$ at each point on the sail 10 is expressed as a function including the expansion coefficient a. It should be noted that a position at which the sunlight 30 is incident is expressed by $\xi$ and $\eta$.

As described above, in the spacecraft 100, the sun vector S and the local incident angle $\beta$ ($\cos(\beta)$) at each arrangement position of the plurality of detection sensors 12 are detected. Hereinafter, an arrangement position at which each detection sensor 12 is arranged will be described as $P_i(x_i, y_i)$. Here, a subscript i is an integer to be $i = 1 \ldots N$, and is an index that indicates each detection sensor. N is the total number of the detection sensors 12 arranged on the sail 10. Further, in order to distinguish from the local incident angle $\beta$ shown in Expression (10), an incident angle of the sunlight 30 detected by the i-th detection sensor 12 will be described as a local incident angle $\beta i^*$ using "*".

The expansion coefficient a is determined such that a difference between $\cos(\beta i)$ shown in Expression (10) and an actually detected $\cos(\beta i^*)$ is minimum. In other words, the expansion coefficient $a = (a_0, a_1, a_2, a_3 \ldots)^T$ is determined so as to achieve $\beta i$ having a minimum error between $\beta i$ and $\beta i^*$, which is the detected value.

In this embodiment, in order to obtain the expansion coefficient a, the least squares method regarding $\cos(\beta i)$ and $\cos(\beta i^*)$ at the arrangement position $P_i$ of each detection sensor is executed. Specifically, the processing of minimizing the following expression is executed.

[Math. 11]

$$\text{minimize} \sum_{i=1}^{N} (\cos\beta_i(a) - \cos\beta_i^*)^2 \quad (11)$$

Expression (11) is an expression for calculating the sum of squares of a difference between $\cos \beta i(a)$, which is a function of the expansion coefficient a, and $\cos(\beta i^*)$, which is the detected value, at all the detection sensors 12. In the minimizing processing, the expansion coefficient a is determined such that the sum is minimum. It should be noted that as shown in Expression (10), $\cos \beta i(a)$ is a non-linear function with respect to the expansion coefficient a. Thus, the minimizing processing is processing of handling a non-linear least squares method.

A specific method for the minimizing processing or the like is not limited. For example, in a case where a displacement of the sail 10 in the Z-axis direction (z(ξ, η)) is sufficiently small and the area of the sail 10 is sufficiently large, it is possible to approximate cos β(a) as a linear function with respect to the expansion coefficient a. Using this approximation, the minimizing processing becomes the processing of handling a linear least squares method. As a result, for example, the expansion coefficient a can be analytically calculated, and time for calculation processing can be sufficiently shortened. In addition to the above, an optional method capable of calculating the expansion coefficient a may be appropriately used.

Using data obtained when the sunlight 30 is incident in different directions, the expansion coefficient a can be solved. In other words, the minimizing processing is performed by using the sun vector S and the local incident angle βi* at each position, in a state where the sun vectors S are different from one another, and thus the expansion coefficient a can be properly calculated.

In this embodiment, in two or more states where the sun vectors S of the sunlight 30 with respect to the reference plane 16 are different from one another, information regarding the local incident angle βi* of the sunlight 30 with respect to the sail 10 at the arrangement position of each of the plurality of detection sensors 12 dispersedly arranged on the sail 10 is acquired. Subsequently, on the basis of the information regarding the sun vectors S in the two or more states and the information regarding the local incident angle βi*, the shape of the sail 10 is estimated.

For example, the spacecraft 100 extends the sail 10 by rotary motion. For that reason, the direction of the sun when viewed from the reference plane 16 of the sail 10, that is, the sun vector S in the XYZ coordinate system fixed to the spacecraft main body 20 changes over time.

In the spacecraft 100, the sun vector S and the local incident angle βi* at each position are acquired at, for example, a predetermined sampling rate. In other words, a data set including the sun vector S and the local incident angle βi* is sequentially acquired at different timings. It should be noted that while the data sets are being acquired at the respective timings, the change in the shape of the sail 10 can be ignored.

Hereinafter, in order to distinguish the data sets acquired at a predetermined sampling rate from one another, an index j (j=1 to M) is used. For example, the sun vectors S and the local incident angles βi*, which are acquired at different timings j, are described as follows.

$$s^j = (s_x^j, s_y^j, s_z^j)^T \quad \text{[Math. 12]}$$

$$\cos \beta_i^{j*}$$

In this embodiment, using the data sets acquired at different timings j, the minimizing processing is executed on the basis of Expression (11). Specifically, the expression to be minimized is expressed as follows.

[Math. 13]

$$\text{minimize} \sum_{i=1}^{N} \sum_{j=1}^{M} (\cos\beta_i^j(a) - \cos\beta_i^{j*})^2 \quad (12)$$

In Expression (12), the data set is acquired at least twice. In other words, the number of times M, by which the data set is acquired, is appropriately set to M≥2. Increasing the number of times M allows the calculation accuracy of the expansion coefficient a to be improved, for example. Alternatively, reducing the number of times M allows time, power, or the like for the minimizing processing to be suppressed.

Further, as described above, it is assumed that the shape of the sail 10 does not change while the data set is being acquired at each timing j. In other words, the expansion coefficient a representing the shape of the sail 10 is constant irrespective of the timing at which each data set is acquired.

The minimizing processing for Expression (12) is executed, and the expansion coefficient a is calculated. The calculated expansion coefficient a is substituted in Expression (5), and thus a position z(ξ, η) of the sail 10 in the Z-axis direction at the arrangement position $P_i$ of each detection sensor 12 is calculated. From z(ξ, η) at each arrangement position $P_i$, a three-dimensional shape including unevenness or the like of the sail 10 is estimated. This allows a sheet-like shape to be highly accurately estimated.

In such a manner, in this embodiment, the position z(ξ, η) in the orthogonal direction orthogonal to the reference plane 16 is estimated for each of the plurality of arrangement positions $P_i$ of the sail 10, and thus the shape of the sail 10 is estimated. This allows the shape of the sail 10 to be easily estimated, for example, without calculating the components in the X-axis direction and the Y-axis direction, or the like. As a result, the amount of operation for shape estimation or the like can be suppressed, and an operation speed or the like can be improved.

For example, when a simulation for the shape estimation was performed on the sail 10 having the size of 50 m×50 m by using the shape estimation method according to the present invention, a maximum estimation error was approximately 0.1 m. In such a manner, the shape can also be estimated with sufficiently high accuracy for a large-sized sheet-like structure.

In the spacecraft 100, for example, the shape estimation processing unit (computer) mounted to the spacecraft main body 20 acquires information such as the sun vector S and the local incident angle β. The shape estimation processing unit calculates the shape of the sail 10, for example, at predetermined intervals on the basis of the acquired information.

The calculated data is transmitted to the control system on the ground or the like. In the control system, for example, the shape of the sail 10 is visualized and monitored. This allows the shape of the sail 10 to be monitored in real time. As a result, for example, it is possible to make a flight plan on the basis of information such as the shape of the sail 10.

It should be noted that the present invention is not limited to the case where the shape estimation processing unit mounted to the spacecraft main body 20 executes the processing of estimating the shape of the sail 10, and the shape of the sail 10 may be estimated by another system or the like. For example, information such as the sun vector S and the local incident angle β may be transmitted to the ground by the spacecraft 100, and the processing of estimating the shape of the sail 10 may be executed by a system on the ground. This can suppress the power consumption of the spacecraft 100, which is involved with the processing of estimating the shape or the like.

Further, the method of acquiring the information regarding the sun vector S is not limited to the method using the sun sensor. For example, the sun vector S may be calculated on the basis of information such as an orbit, an attitude, or a position of the spacecraft 100. In this case, information regarding the calculated sun vector S is appropriately transmitted to a computer that performs the processing of estimating the shape, or the like. With this configuration, for example, even in a case where the sun sensor is not mounted to the spacecraft main body 20, the shape of the sail 10 can be easily estimated.

In the above description, the thin-film solar cell 40 is used as the detection sensor 12 for detecting the local incident angle β of the sunlight 30. In the present invention, a temperature sensor can also be used as the detection sensor 12.

Figure 5:
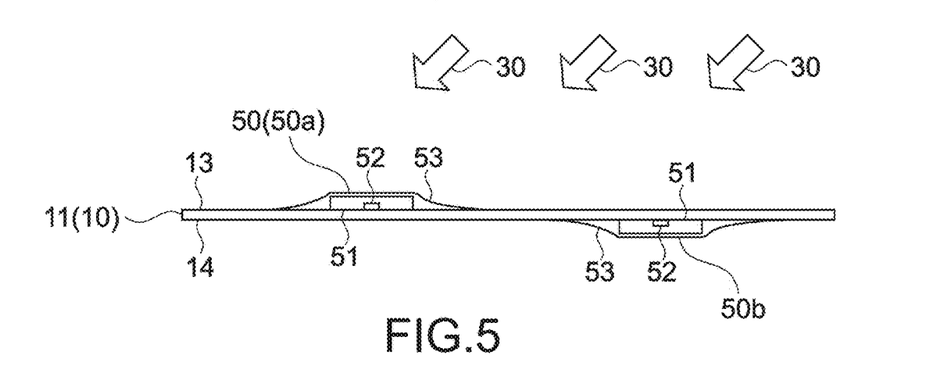
FIG. 5 is a schematic view of a configuration example of a temperature sensor.

FIG. 5 is a schematic view of a configuration example of a temperature sensor 50. The temperature sensor 50 (detection sensor 12) includes a sensor plate 51, a temperature detection element 52, and a cover film 53. The sensor plate 51 has a flat plate-like shape and is arranged along the in-plane direction of the sail 10 (sheet-like member 11). For the sensor plate 51, for example, a member having high heat conductivity is used.

The temperature detection element 52 is thermally connected to the sensor plate 51 and detects the temperature of the sensor plate 51. For example, as shown in FIG. 5, the temperature detection element 52 is embedded in the sensor plate 51. For the temperature detection element 52, for example, a resistive element (resistance thermometer) whose resistivity changes according to the temperature, a thermocouple (thermocouple thermometer) that measures temperature using a thermoelectromotive force, or the like is used. In addition to the above, an optional element capable of measuring temperature may be used as the temperature detection element.

The cover film 53 is arranged so as to cover the sensor plate 51 installed on the sail 10 and fixes the sensor plate 51 and the temperature detection element 52 to the sail 10.

FIG. 5 shows a temperature sensor 50a arranged on the front surface 13 of the sail 10, on which the sunlight 30 is incident, and a temperature sensor 50b installed on the back surface 14 of the sail 10. In such a manner, the temperature sensor 50 can be installed on both of the front surface 13 and the back surface 14 of the sail 10. For example, the plurality of temperature sensors 50 may be arranged on one of the front surface 13 and the back surface 14 of the sail 10 or may be installed on both of the front surface 13 and the back surface 14 of the sail 10.

For example, it is assumed that optical characteristics such as absorptivity of light or emissivity of light (infrared light) are determined for the members (sensor plate 51 and cover film 53) constituting the temperature sensor 50. In this case, a temperature $T_{sensor}$ detected by the temperature sensor 50 has a value corresponding to the local incident angle β of the sunlight 30.

For example, when the sunlight 30 is incident on the sensor plate 51, part of the sunlight 30 is absorbed and the temperature of the sensor plate 51 rises. At that time, the amount of heat absorbed by the sensor plate 51 is proportional to cos(β). Meanwhile, the amount of heat is released (radiated) from the sensor plate 51 to the space via the front surface 13 and the back surface 14 of the sail 10. The balance of the amount of heat in the sensor plate 51 is calculated in such a manner, and thus the local incident angle β can be obtained from the temperature $T_{sensor}$ detected by the temperature sensor 50.

In such a manner, also in a case where the temperature sensor 50 is used, it is possible to acquire information regarding the local incident angle β of the sunlight 30 with respect to the sail 10 at each arrangement position of the plurality of temperature sensors 50 dispersedly arranged on the sail 10. This allows the shape of the sail 10 to be highly accurately estimated.

It should be noted that the present invention is not limited to a case where one of the thin-film solar cell 40 and the temperature sensor 50 is used as the detection sensor 12. For example, both the thin-film solar cell 40 and the temperature sensor 50 may be appropriately used as the detection sensors 12. In this case, the degree of freedom in designing the sail 10 or the like can be improved.

Hereinabove, in the sail 10 according to this embodiment, the plurality of detection sensors 12 are dispersedly arranged on the sheet-like member 11, on which the sunlight 30 is incident, along the in-plane direction of the sheet-like member 11. From the detection result of each detection sensor 12, the local incident angle β of the sunlight 30 with respect to the sheet-like member 11 is detected at the arrangement position of each detection sensor 12. This allows the sheet-like shape to be highly accurately estimated.

In the sail 10 according to this embodiment, the local incident angle β of the sunlight 30 with respect to the sail 10 at each point is detected by the detection sensor 12 arranged at each point on the sail 10. In such a manner, the angles of the sunlight incident on the respective points are dispersedly measured, and thus information necessary to estimate the shape of the sail 10 at a desired accuracy can be easily acquired.

For example, in a case where the spacecraft 100 (sail 10) is a solar power sail configured to perform photovoltaic generation, cells (thin-film solar cells) or the like used for photovoltaic generation can be used as the detection sensors 12 as they are. So, the shape of the sail 10 can be easily estimated without substantially increasing the weight of the spacecraft main body 20, or the like.

Further, in this embodiment, the information items regarding the sun vector S and the local incident angle β are detected in two or more states where the sun vectors S are different from one another. Using those information items, an error when the shape of the sail 10 is estimated or the like can be sufficiently reduced. As a result, the shape of the sail 10 can be estimated with a sufficiently high accuracy.

The shape of the sail 10 is estimated by calculating a component orthogonal to the reference plane 16 at each point. In other words, the processing of calculating the Z component among the three-dimensional components representing the respective points is executed. This allows the shape estimation for the sail 10 to be executed at high speed. Further, since a calculation load is small, mounting capable of on-board processing allows the calculation to be easily automated.

It should be noted that the information regarding the sun vector S and the local incident angle β, the information regarding the shape of the sail 10, or the like has a size sufficiently smaller than, for example, the size of image data or the like. Thus, those information items can be easily transferred. As a result, the shape of the sail 10 can be easily monitored in real time.

In such a manner, the shape of the sail 10 is highly accurately estimated, and thus an action of a radiation pressure, which is received by the sail 10, on the motion of the spacecraft 100, or the like can be investigated in detail. For example, an influence of the shape of the sail 10 on a rotation or an attitude of the spacecraft 100 (solar sail), or the like can be investigated in detail on the basis of an actual measurement result. Further, in a case where an adjustment mechanism that adjusts the shape of the sail 10, or the like is mounted, estimated shape data can be fed back to highly accurately adjust the shape of the sail 10.

3. Other Sheet-Like Structures

In the above description, the solar sail has been described as an example of a large-sized structure (sheet-like structure) having a sheet-shaped structure. A huge structure constituted by such a sheet-like member (thin film, mesh, or the like) having flexibility is referred to as a gossamer structure. Hereinafter, a gossamer structure different from the sail 10 will be described.

Figure 6A:
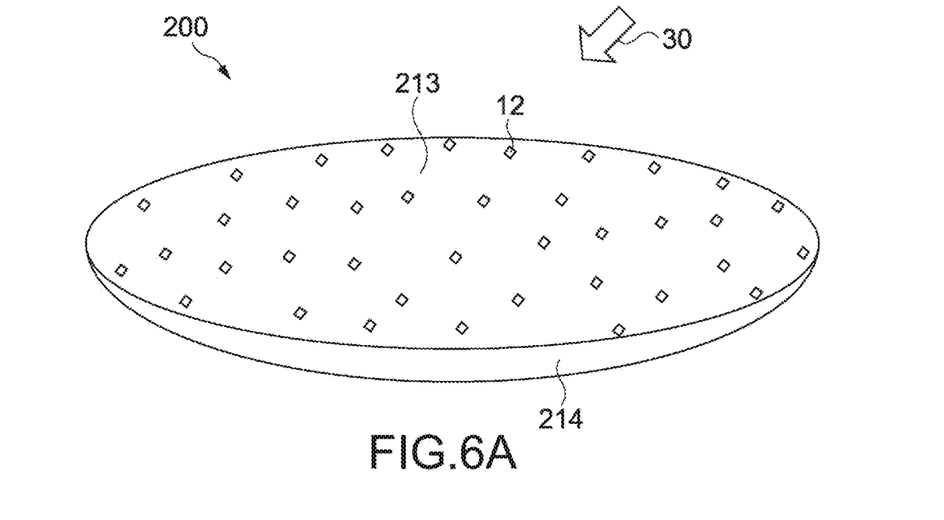
FIG. 6A is a schematic view of a configuration example of a gossamer structure.
Figure 6B:
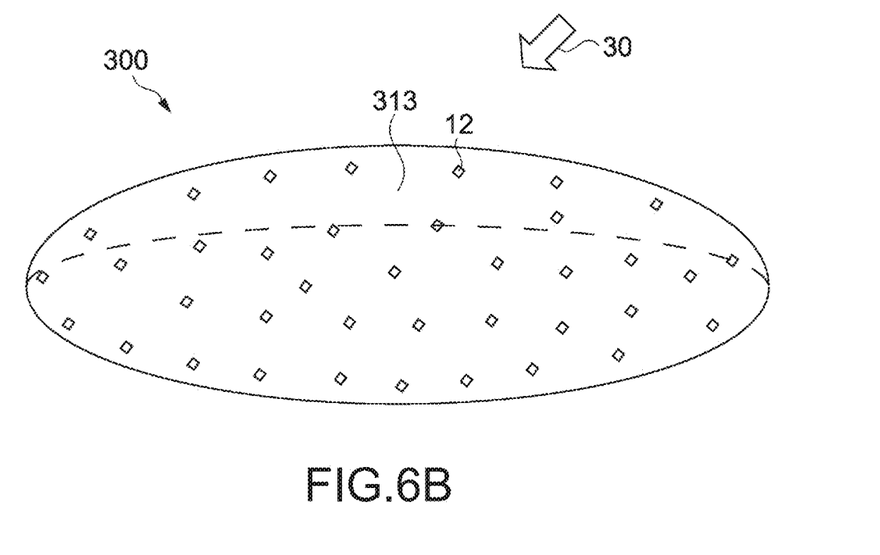
FIG. 6B is a schematic view a configuration example of a gossamer structure.

FIG. 6A is a schematic view of an example of a gossamer structure 200 including a concave front surface 213, on which the sunlight 30 is incident. FIG. 6B is a schematic view of an example of a gossamer structure 300 including a convex front surface 313, on which the sunlight 30 is incident. It should be noted that the present invention is applicable irrespective of the size, the shape, or the like of the gossamer structures 200 and 300.

As shown in FIG. 6A, if a huge sheet-like structure (gossamer structure 200) including the concave front surface 213 is constituted, for example, an electromagnetic wave or the like incident on the front surface 213 can be collected at a predetermined point. For example, the concave front surface 213 is configured to be capable of reflecting the sunlight 30, thus achieving a condensing apparatus that condenses the sunlight 30. Further, the concave front surface 213 is configured to be capable of reflecting an electromagnetic wave having a predetermined frequency, thus achieving a huge antenna, radio telescope, or the like.

The detection sensors 12 (thin-film solar cells 40, temperature sensors 50, or the like) are dispersedly arranged on such a gossamer structure 200, and thus the shape of the gossamer structure 200 can be easily estimated. FIG. 6A illustrates the detection sensors 12 dispersedly arranged on the front surface 213. It should be noted that in a case where the detection sensors 12 are the temperature sensors 50, the detection sensors 12 may be arranged on a back surface 214 opposite to the front surface 213.

For example, a condensing efficiency of the condensing apparatus, a detection accuracy of the antenna (radio telescope), and the like can be investigated in detail on the basis of the estimated shape. Further, in a case where the shape of the gossamer structure 200 or the like is adjustable, the shape estimation enables highly accurate adjustment.

As shown in FIG. 6B, if a gossamer structure 300 including the convex front surface 313 is constituted, a structure such as a huge dome, tent, or the like can be achieved. Also in this case, the detection sensors 12 are dispersedly arranged on the gossamer structure 300, and thus the shape thereof can be easily estimated.

It should be noted that the environment in which the gossamer structures 200 and 300 are arranged, or the like is not limited. For example, each structure may be arranged in space. In this case, for example, each of the gossamer structures 200 and 300 functions as a plant on an orbit for space-based solar power or a huge sunlight shield. Further, each structure may be arranged on the ground as a huge construction. In any case, the shape of each structure can be easily estimated by application of the present invention.

REFERENCE SIGNS LIST

10 sail
11 sheet-like member
12 detection sensor
13 front surface
14 back surface
16 reference plane
20 spacecraft main body
30 sunlight
40 thin-film solar cell
50, 50a, 50b temperature sensor
100 spacecraft
200, 300 gossamer structure
β local incident angle
n local normal vector
P arrangement position
S sun vector

The invention claimed is:

1. A sheet-like structure, comprising:
   a sheet-like member that extends along an in-plane direction orthogonal to a thickness direction and receives light incident on the sheet-like member, wherein the sheet-like member is composed of bendable material; and
   a plurality of detection sensors that are dispersedly arranged on the sheet-like member along the in-plane direction and are for detecting an incident angle of the light with respect to a normal direction of the sheet-like member at each arrangement position of the plurality of detection sensors,
   wherein each detection sensor of the plurality of detection sensors comprises a detection region that receives the light and is arranged along the in-plane direction, and
   wherein light shielding is omitted from the detection region of each detection sensor, such that an entirety of the detection region of each detection sensor receives the light.

2. The sheet-like structure according to claim 1, wherein the light includes sunlight, and
   the plurality of detection sensors include a thin-film solar cell.

3. The sheet-like structure according to claim 1, wherein the plurality of detection sensors include a temperature sensor.

4. The sheet-like structure according to claim 1, wherein a maximum dimension of a planar shape of the sheet-like member is 1000 times larger than a thickness of the sheet-like member.

5. The sheet-like structure according to claim 1,
   wherein the detection sensors of the plurality of detection sensors are dispersedly arranged in such a way that a distance between adjacent detection regions is larger than a maximum dimension of any detection region.

6. A spacecraft, comprising:
   a sheet-like structure; and
   a main body connected to the sheet-like structure, the sheet-like structure including
      a sheet-like member that extends along an in-plane direction orthogonal to a thickness direction and receives light incident on the sheet-like member, wherein the sheet-like member is composed of bendable material; and
      a plurality of detection sensors that are dispersedly arranged on the sheet-like member along the in-plane direction and are for detecting an incident angle of the light with respect to a normal direction of the sheet-like member at each arrangement position of the plurality of detection sensors,
   wherein each detection sensor of the plurality of detection sensors comprises a detection region that receives the light and is arranged along the in-plane direction, and wherein light shielding is omitted from the detection region of each detection sensor, such that an entirety of the detection region of each detection sensor receives the light.

7. The spacecraft according to claim 6, wherein the light includes sunlight, and the main body includes a sun sensor that detects an incident direction of the sunlight.

\* \* \* \* \*